(12) United States Patent
Xu

(10) Patent No.: US 12,263,668 B2
(45) Date of Patent: Apr. 1, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Feng Xu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/753,308

(22) PCT Filed: Feb. 16, 2022

(86) PCT No.: PCT/CN2022/076418
§ 371 (c)(1),
(2) Date: Feb. 27, 2022

(87) PCT Pub. No.: WO2023/147711
PCT Pub. Date: Aug. 10, 2023

(65) Prior Publication Data
US 2024/0034026 A1    Feb. 1, 2024

(30) Foreign Application Priority Data
Feb. 7, 2022    (CN) .......................... 202210116313.8

(51) Int. Cl.
*B32B 7/12*    (2006.01)
*B32B 23/04*    (2006.01)
(Continued)

(52) U.S. Cl.
CPC ................ *B32B 7/12* (2013.01); *B32B 23/04* (2013.01); *B32B 23/20* (2013.01); *B32B 27/06* (2013.01);
(Continued)

(58) Field of Classification Search
CPC ........... B32B 7/12; B32B 23/04; B32B 23/20; B32B 27/06; B32B 27/281; B32B 27/36;
(Continued)

(56) References Cited

U.S. PATENT DOCUMENTS

2015/0258750 A1* 9/2015 Kang .................... B32B 27/308
264/261
2020/0310192 A1* 10/2020 Fuchida ............... G02B 5/3083

FOREIGN PATENT DOCUMENTS

CN        208488632 U        2/2019
CN        111239862 A        6/2020
(Continued)

OTHER PUBLICATIONS ip.com translation of CN113593414A (Year: 2024).*
(Continued)

*Primary Examiner* — Michael Zhang
(74) *Attorney, Agent, or Firm* — PV IP PC; Wei Te Chung

(57) ABSTRACT

A display panel includes a panel body, a polarizing layer, and a cover module. The panel body includes a functional area corresponding to an external camera. The polarizing layer is disposed on a light-emitting side of the panel body. The cover module is disposed on a side of the polarizing layer away from the panel body. A portion of the cover module corresponding to the functional area has a total in-plane phase difference of less than or equal to 100 nm or greater than or equal to 7500 nm.

12 Claims, 6 Drawing Sheets

(51) Int. Cl.
*B32B 23/20* (2006.01)
*B32B 27/06* (2006.01)
*B32B 27/28* (2006.01)
*B32B 27/36* (2006.01)
*H04N 23/53* (2023.01)
*H05K 5/03* (2006.01)
*H10K 59/80* (2023.01)

(52) U.S. Cl.
CPC ............ *B32B 27/281* (2013.01); *B32B 27/36* (2013.01); *H05K 5/03* (2013.01); *H10K 59/873* (2023.02); *B32B 2307/412* (2013.01); *B32B 2307/42* (2013.01); *B32B 2457/20* (2013.01); *H04N 23/53* (2023.01)

(58) Field of Classification Search
CPC .......... B32B 2307/412; B32B 2307/42; B32B 2457/20; H05K 5/03; H10K 59/873

See application file for complete search history.

(56) References Cited

FOREIGN PATENT DOCUMENTS

| | | | |
|---|---|---|---|
| CN | 111856630 A | | 10/2020 |
| CN | 112689816 A | | 4/2021 |
| CN | 112736120 A | | 4/2021 |
| CN | 112967603 A | | 6/2021 |
| CN | 113015928 A | | 6/2021 |
| CN | 113593414 A | * | 11/2021 |
| CN | 113628546 A | | 11/2021 |
| CN | 113986037 A | | 1/2022 |
| JP | 2021196575 A | | 12/2021 |

OTHER PUBLICATIONS

Espacenet Translation of CN 113593414 A (Year: 2024).*
International Search Report in International application No. PCT/CN2022/076418, mailed on Nov. 4, 2022.
Written Opinion of the International Search Authority in International application No. PCT/CN2022/076418, mailed on Nov. 4, 2022.
Chinese Office Action issued in corresponding Chinese Patent Application No. 202210116313.8 dated Mar. 16, 2023, pp. 1-6.

* cited by examiner

DISPLAY PANEL AND DISPLAY DEVICE

FIELD OF INVENTION

The present disclosure relates to the technical field of display, and particularly to a display panel and a display device.

BACKGROUND

A current organic light emitting diode (OLED) panel is provided with an under-screen camera, and the OLED panel includes a panel body, a polarizing layer disposed on the panel body, and a foldable cover plate disposed on the polarizing layer.

In a process of researching and practicing the prior art, the inventor of the present application found that when the foldable cover plate is made of a general material, photos taken by the under-screen camera have obvious rainbow stripes, which reduces a quality of the photos.

SUMMARY OF DISCLOSURE

The present disclosure provides a display panel and a display device for improving rainbow stripes in photos taken by an under-screen camera.

The present disclosure provides a display panel comprising:
- a panel body comprising a functional area and a display area surrounding at least a portion of the functional area;
- a polarizing layer disposed on a light-emitting side of the panel body; and
- a cover module disposed on a side of the polarizing layer away from the panel body, wherein at least a portion of the cover module corresponding to the functional area has a total in-plane phase difference of less than or equal to 100 nm or greater than or equal to 7500 nm.

Optionally, in some embodiments, a portion of the cover module corresponding to the display area has the same total in-plane phase difference.

Optionally, in some embodiments, the cover module comprises:
- a first optical adhesive layer disposed on the side of the polarizing layer away from the panel body; and
- a first flexible layer disposed on a side of the first optical adhesive layer away from the polarizing layer and having an in-plane phase difference of less than or equal to 100 nm or greater than or equal to 7500 nm.

Optionally, in some embodiments, the cover module further comprises:
- a second optical adhesive layer disposed on a side of the first flexible layer away from the polarizing layer; and
- a hardened layer disposed on a side of the second optical adhesive layer away from the polarizing layer;
- wherein a laminated structure of the first flexible layer and the hardened layer has an in-plane phase difference of less than or equal to 100 nm or greater than or equal to 7500 nm.

Optionally, in some embodiments, the cover module further comprises:
- a third optical adhesive layer disposed on a side of the hardened layer away from the polarizing layer; and
- a second flexible layer disposed on a side of the third optical adhesive layer away from the polarizing layer;
- wherein a laminated structure of the first flexible layer, the hardened layer, and the second flexible layer has an in-plane phase difference of less than or equal to 100 nm or greater than or equal to 7500 nm.

Optionally, in some embodiments, an edge of the second flexible layer is flush with an edge of the third optical adhesive layer.

Optionally, in some embodiments, an angle between an orientation direction of the first flexible layer and an orientation direction of the second flexible layer is less than or equal to 15°.

Optionally, in some embodiments, the cover module further comprises:
- a fourth optical adhesive layer disposed on a side of the second flexible layer away from the polarizing layer; and
- a third flexible layer disposed on a side of the fourth optical adhesive layer away from the polarizing layer;
- wherein a laminated structure of the first flexible layer, the hardened layer, the second flexible layer, and the third flexible layer has an in-plane phase difference of less than or equal to 100 nm or greater than or equal to 7500 nm.

Optionally, in some embodiments, the cover module further comprises:
- a second optical adhesive layer disposed on the side of the polarizing layer away from the panel body; and
- a hardened layer disposed between the second optical adhesive layer and the first optical adhesive layer, and disposed on a side of the first flexible layer close to the polarizing layer;
- wherein a laminated structure of the hardened layer and the first flexible layer has an in-plane phase difference of less than or equal to 100 nm or greater than or equal to 7500 nm.

Optionally, in some embodiments, an edge of the first flexible layer is flush with an edge of the first optical adhesive layer.

Optionally, in some embodiments, the cover module further comprises:
- a third optical adhesive layer disposed on a side of the first flexible layer away from the polarizing layer; and
- a second flexible layer disposed on a side of the third optical adhesive layer away from the polarizing layer;
- wherein a laminated structure of the hardened layer, the first flexible layer, and the second flexible layer has an in-plane phase difference of less than or equal to 100 nm or greater than or equal to 7500 nm.

Optionally, in some embodiments, an angle between an orientation direction of the first flexible layer and an orientation direction of the second flexible layer is less than or equal to 15°.

The present disclosure further provides a display device comprising a camera and the display panel according to any of the above embodiments. The display panel comprises: a panel body comprising a functional area and a display area surrounding at least a portion of the functional area; a polarizing layer disposed on a light-emitting side of the panel body; and a cover module disposed on a side of the polarizing layer away from the panel body, wherein at least a portion of the cover module corresponding to the functional area has a total in-plane phase difference of less than or equal to 100 nm or greater than or equal to 7500 nm. The camera is disposed under the display panel and corresponds to the functional area.

Optionally, in some embodiments, a portion of the cover module corresponding to the display area has the same total in-plane phase difference.

Optionally, in some embodiments, the cover module comprises:
a first optical adhesive layer disposed on the side of the polarizing layer away from the panel body; and
a first flexible layer disposed on a side of the first optical adhesive layer away from the polarizing layer and having an in-plane phase difference of less than or equal to 100 nm or greater than or equal to 7500 nm.

Optionally, in some embodiments, the cover module further comprises:
a second optical adhesive layer disposed on a side of the first flexible layer away from the polarizing layer; and
a hardened layer disposed on a side of the second optical adhesive layer away from the polarizing layer;
wherein a laminated structure of the first flexible layer and the hardened layer has an in-plane phase difference of less than or equal to 100 nm or greater than or equal to 7500 nm.

Optionally, in some embodiments, the cover module further comprises:
a third optical adhesive layer disposed on a side of the hardened layer away from the polarizing layer; and
a second flexible layer disposed on a side of the third optical adhesive layer away from the polarizing layer;
wherein a laminated structure of the first flexible layer, the hardened layer, and the second flexible layer has an in-plane phase difference of less than or equal to 100 nm or greater than or equal to 7500 nm.

Optionally, in some embodiments, an edge of the second flexible layer is flush with an edge of the third optical adhesive layer.

Optionally, in some embodiments, an angle between an orientation direction of the first flexible layer and an orientation direction of the second flexible layer is less than or equal to 15°.

Optionally, in some embodiments, the cover module further comprises:
a fourth optical adhesive layer disposed on a side of the second flexible layer away from the polarizing layer; and
a third flexible layer disposed on a side of the fourth optical adhesive layer away from the polarizing layer;
wherein a laminated structure of the first flexible layer, the hardened layer, the second flexible layer, and the third flexible layer has an in-plane phase difference of less than or equal to 100 nm or greater than or equal to 7500 nm.

Optionally, in some embodiments, the cover module further comprises:
a second optical adhesive layer disposed on the side of the polarizing layer away from the panel body; and
a hardened layer disposed between the second optical adhesive layer and the first optical adhesive layer, and disposed on a side of the first flexible layer close to the polarizing layer;
wherein a laminated structure of the hardened layer and the first flexible layer has an in-plane phase difference of less than or equal to 100 nm or greater than or equal to 7500 nm.

Optionally, in some embodiments, an edge of the first flexible layer is flush with an edge of the first optical adhesive layer.

Optionally, in some embodiments, the cover module further comprises:
a third optical adhesive layer disposed on a side of the first flexible layer away from the polarizing layer; and
a second flexible layer disposed on a side of the third optical adhesive layer away from the polarizing layer;
wherein a laminated structure of the hardened layer, the first flexible layer, and the second flexible layer has an in-plane phase difference of less than or equal to 100 nm or greater than or equal to 7500 nm.

Optionally, in some embodiments, an angle between an orientation direction of the first flexible layer and an orientation direction of the second flexible layer is less than or equal to 15°.

In a display panel and a display device of the present disclosure, a panel body comprises a functional area, a polarizing layer is disposed on a light-emitting side of the panel body, a cover module is disposed on a side of the polarizing layer away from the panel body, a portion of the cover module corresponding to the functional area has a total in-plane phase difference of less than or equal to 100 nm or greater than or equal to 7500 nm.

In the present disclosure, the cover plate module disposed on the polarizing layer is set to have the total in-plane phase difference of less than or equal to 100 nm or greater than or equal to 7500 nm, thereby improving the rainbow stripes in the photos and improving shooting quality.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. Furthermore, it should be understood that specific embodiments described herein are only used to illustrate and explain the present disclosure, and not to limit the present disclosure. In the present disclosure, unless otherwise stated, directional terms "upper" and "lower" generally refer to upper and lower sides of a device in actual use or working state, particularly the upper and lower sides of the device shown in the accompanying drawings. And, directional terms "inner" and "outer" refer to a position relative to an outline of the device.

The present disclosure provides a display panel and a display device, which will be described in detail below. It should be noted that a described order of the following embodiments is not intended to limit a preferred order of the embodiments.

Figure 1:
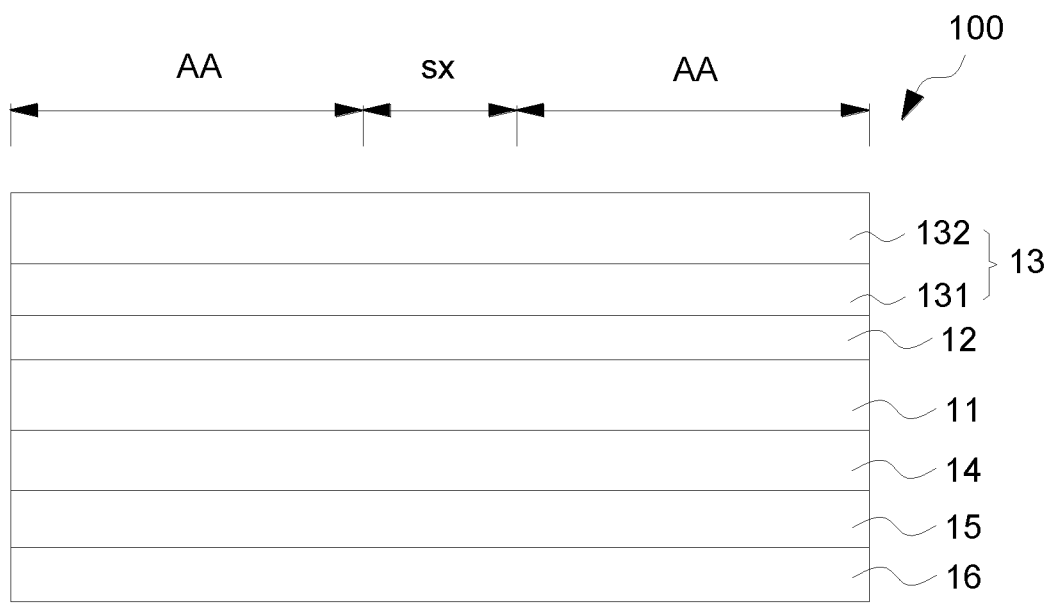
FIG. 1 is a schematic structural diagram of a display panel according to a first embodiment of the present disclosure.

Please refer to FIG. 1, a first embodiment of the present disclosure provides a display panel 100, which includes a panel body 11, a polarizing layer 12, and a cover module 13.

The panel body 11 comprises a functional area sx and a display area AA surrounding at least a portion of the functional area sx. The polarizing layer 12 is disposed on a light-emitting side of the panel body 11. The cover module 13 is disposed on a side of the polarizing layer 12 away from the panel body 11.

A portion of the cover module 13 corresponding to the functional area sx has a total in-plane phase difference of less than or equal to 100 nm or greater than or equal to 7500 nm.

In the display panel 100 of the first embodiment of the present disclosure, the total in-plane phase difference of the portion of the cover module 13 disposed on the polarizing layer 12 is set to be less than or equal to 100 nm or greater than or equal to 7500 nm, so as to improve rainbow stripes in photos, thereby improving shooting quality.

It should be noted that the total in-plane phase difference may be a sum of in-plane phase differences of layers. An actual value of the total in-plane phase difference is a value obtained by actually measuring the cover module 13.

Optionally, the polarizing layer 12 may be formed on the panel body 11, or may be attached to the panel main body 11 through a glue.

Optionally, only the portion of the cover module 13 corresponding to the functional area sx has a total in-plane phase difference of less than or equal to 100 nm or greater than or equal to 7500 nm. Or, a portion of the cover module 13 corresponding to the display area AA also has the total in-plane phase difference of less than or equal to 100 nm or greater than or equal to 7500 nm. That is, the portion of the cover module 13 corresponding to the display area AA has the same total in-plane phase difference as the portion of the cover module 13 corresponding to the functional area sx.

Optionally, the total in-plane phase difference may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

Optionally, the total in-plane phase difference is less than or equal to 50 nm or greater than or equal to 8500 nm. For example, the total in-plane phase difference may be 50 nm, 40 nm, 30 nm, 20 nm, 10 nm, 8500 nm, 9500 nm, 10000 nm, 15000 nm, or the like.

It should be noted that an in-plane phase difference of a film layer is related to a production process of the film layer. Generally, a film layer produced by a melt casting process is a non-stretched and non-oriented film layer with no apparent orientation. After the film layer is uniaxially or biaxially stretched, the film layer has an orientation direction. At this time, the film layer having the orientation direction has an in-plane phase difference.

Optionally, the cover module 13 comprises a first optical adhesive layer 131 and a first flexible layer 132.

The first optical adhesive layer 131 is disposed on the side of the polarizing layer 12 away from the panel body 11. The first flexible layer 132 is disposed on a side of the first optical adhesive layer 131 away from the polarizing layer 12

The first flexible layer 132 has an in-plane phase difference of less than or equal to 100 nm or greater than or equal to 7500 nm.

That is, the in-plane phase difference of the first flexible layer 132 may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

Optionally, the optical adhesive layer 131 has an in-plane phase difference of 0 nm. Optionally, the number of each of the first optical adhesive layer 131 and the first flexible layer 132 is one.

Optionally, the first flexible layer 132 may have a single-layer structure, or may be formed by stacking a plurality of sub-layers. Optionally, the first flexible layer 132 has a thickness of 25 μm to 200 μm, for example, may be 25 μm, 50 μm, 100 μm, 150 μm, or 200 μm.

It should be noted that the thickness of the first flexible layer 132 may be set according to actual needs. For example, when the display panel 100 has a bending radius of 3 mm, and the layers need to be bent more than 200,000 times without damage, the thickness of the flexible layer 132 may be set to 25 μm to 100 μm, for example, 25 μm, 50 μm, 80 μm, or 100 μm.

Optionally, the first flexible layer 132 is made of at least one of transparent polyimide (CPI), polyethylene terephthalate (PET), and triacetate cellulose (TAC).

It should be noted that in the first embodiment, the first flexible layer 132 is made of one of transparent polyimide (CPI), polyethylene terephthalate (PET), and triacetate cellulose (TAC). The first flexible layer 132 may also be made of other materials, which will not be described in detail herein.

Optionally, the first optical adhesive layer 131 has a thickness of 20 μm to 60 μm, for example, may be 20 μm, 30 μm, 40 μm, 50 μm, and 60 μm.

Optionally, the display panel 100 may further comprise a back plate 14, a foam layer 15, and a support sheet 16 that are sequentially disposed on a side of the panel body 11 away from the polarizing layer 12.

The back plate 14, the foam layer 15, and the support sheet 16 are provided with an opening corresponding to the functional areas sx. The opening may penetrate through the back plate 14, the foam layer 15, and the support sheet 16.

In some embodiments, the opening penetrates through the foam layer 15 and the support sheet 16. The back plate 14 has an in-plane phase difference of 0 nm.

Figure 2:
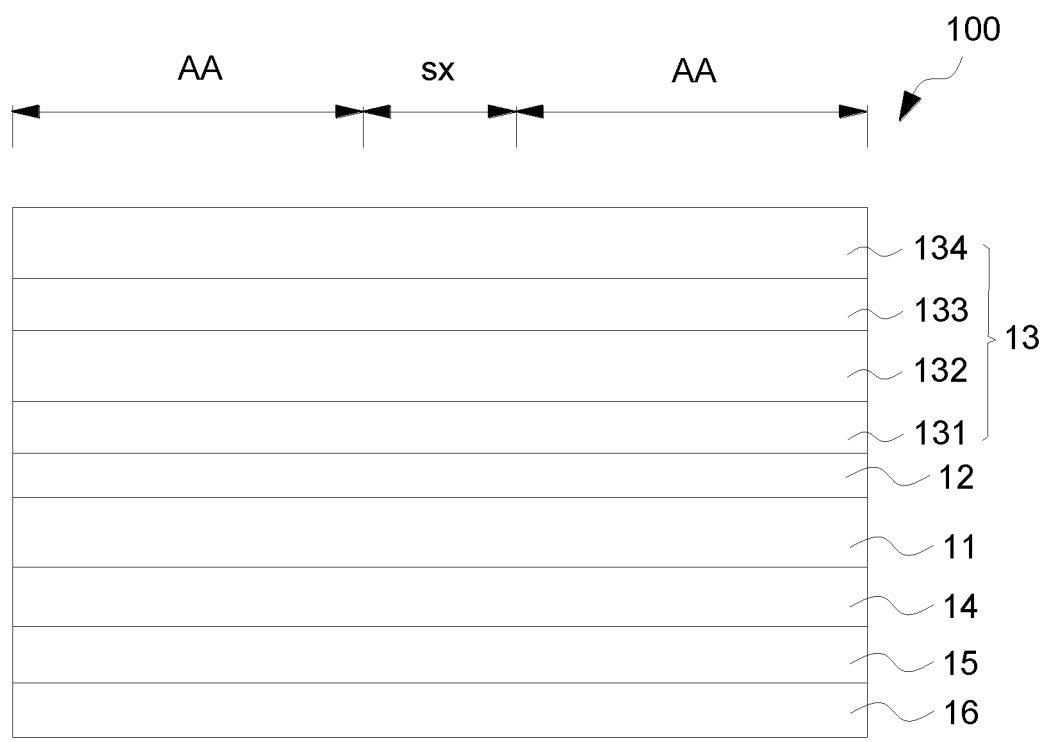
FIG. 2 is a schematic structural diagram of a display panel according to a second embodiment of the present disclosure.

Please refer to FIG. 2, a display panel 100 of a second embodiment differs from the display panel 100 of the first embodiment in that the cover module 13 further includes a second optical adhesive layer 133 and a hardening layer 134.

The second optical adhesive layer 133 is disposed on a side of the first flexible layer 132 away from the polarizing layer 12. The hardened layer 134 is disposed on a side of the second optical adhesive layer 133 away from the polarizing layer 12.

A laminated structure of the first flexible layer 132 and the hardened layer 134 has an in-plane phase difference of less than or equal to 100 nm or greater than or equal to 7500 nm.

That is, the in-plane phase difference of the laminated structure of the first flexible layer 132 and the hardened layer 134 may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

Optionally, a thickness of the hardened layer 134 is less than the thickness of the first flexible layer 132.

The hardened layer 134 protects the panel body 11 and prevents the first flexible layer 132 from being scratched. The thickness of the hardened layer 134 is set to be less than the thickness of the first flexible layer 132 to ensure that the display panel 100 is flexible.

The thickness of the hardened layer 134 is 3 μm to 10 μm, for example, may be 3 μm, 5 μm, 7 μm, 9 μm, or 10 μm.

Optionally, the hardened layer 134 may be made of ultra-thin glass (UTG) or other hard coatings. An in-plan phase difference of the hardened layer 134 may be 0 nm.

Figure 3:
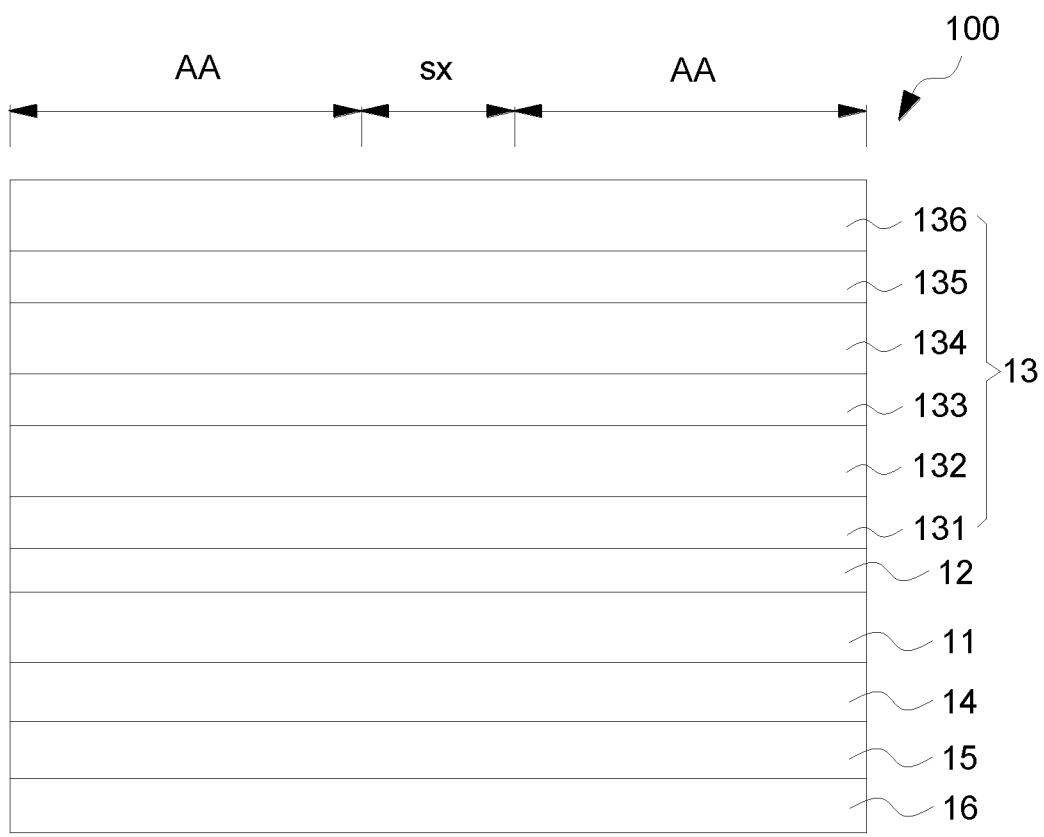
FIG. 3 is a schematic structural diagram of a display panel according to a third embodiment of the present disclosure.

Please refer to FIG. 3, a display panel 100 of a third embodiment differs from the display panel 100 of the second embodiment in that the cover module 13 further includes a third optical adhesive layer 135 and a second flexible layer 136.

The third optical adhesive layer 135 is disposed on a side of the hardened layer 134 away from the polarizing layer 12. The second flexible layer 136 is disposed on a side of the third optical adhesive layer 135 away from the polarizing layer 12.

A laminated structure of the first flexible layer 132, the hardened layer 134, and the second flexible layer 136 has an in-plane phase difference of less than or equal to 100 nm or greater than or equal to 7500 nm.

That is, the in-plane phase difference of the laminated structure of the first flexible layer 132, the hardened layer 134, and the second flexible layer 136 may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

Optionally, the in-plan phase difference of the hardened layer 134 may be 0 nm.

Optionally, an edge of the second flexible layer 136 is flush with an edge of the third optical adhesive layer 135.

The second flexible layer 136 and the third optical adhesive layer 135 are first combined together, and then trimmed so that their edges are flush with each other, and then attached to the hardened layer 134. Compared with a process of coating the third optical adhesive layer 135 first and then attaching the second flexible layer 136, this process is simpler and makes attachment of the second flexible layer 136 more accurate.

Furthermore, the edge of the second flexible layer 136 is flush with the edge of the third optical adhesive layer 135, so that the second flexible layer 136 and the hardened layer 134 are adhered more completely.

Optionally, an angle between an orientation direction of the first flexible layer 132 and an orientation direction of the second flexible layer 136 is less than or equal to 15°, which may be 15°, 10°, 5°, or 0°.

It should be noted that an orientation direction of a flexible layer is a direction in which the flexible layer is stretched. For example, a stretched direction of the first flexible layer 132 is parallel to an x-axis of a two-dimensional coordinate system, a stretched direction of the second flexible layer 136 intersects the x-axis, so that an angle at which the stretched direction of the second flexible layer 136 is deflected with respect to the x-axis is the angle between the orientation direction of the first flexible layer 132 and the orientation direction of the second flexible layer 136.

Furthermore, when two flexible layers are stacked, if a difference between orientation directions of the two flexible layers is less than or equal to 15°, a total in-plane phase difference of the two flexible layers is greater than an in-plane phase difference of any one of the two flexible layers. If the difference between the orientation directions of the two flexible layers is greater than 15°, the total in-plane phase difference of the two flexible layers may be less than or equal to the in-plane phase difference of any one of the two flexible layers.

Therefore, a difference between the orientation directions of the first flexible layer 132 and the second flexible layer 136 is set to be less than or equal to 15°, so as to facilitate estimation of the total in-plane phase difference and improve production efficiency.

Optionally, the orientation directions of the first flexible layer 132 and the second flexible layer 136 are parallel to each other, so as to improve the total in-plane phase difference.

Optionally, the in-plane phase difference of the first flexible layer 132 may be same as the in-plane phase difference of the second flexible layer 136, which is beneficial for reducing optical complexity and improving the rainbow stripes in photography.

In some embodiments, the in-plane phase difference of the first flexible layer 132 and the in-plane phase difference of the second flexible layer 136 may be different. For example, the in-plane phase difference of the first flexible layer 132 is 0 or 5 nm, and the in-plane phase difference of the second flexible layer 136 is 90 nm.

When the total in-plane phase difference of the cover module 13 is less than or equal to 100 nm, each of the first flexible layer 132 and the second flexible layer 136 has a low in-plane phase difference. For example, the in-plane phase difference of the first flexible layer 132 and the in-plane phase difference of the second flexible layer 136 are both less than or equal to 100 nm.

When the total in-plane phase difference of the cover module 13 is greater than or equal to 7500 nm, each of the first flexible layer 132 and the second flexible layer 136 has a high in-plane phase difference. For example, the in-plane phase difference of the first flexible layer 132 and the in-plane phase difference of the second flexible layer 136 are both greater than or equal to 2000 nm.

It should be noted that film layers of a same material may have different in-plane phase differences after undergoing different preparation processes. For example, a film layer of a PET material may be a film layer with a low in-plane phase difference or a film layer with a high in-plane phase difference.

Figure 4:
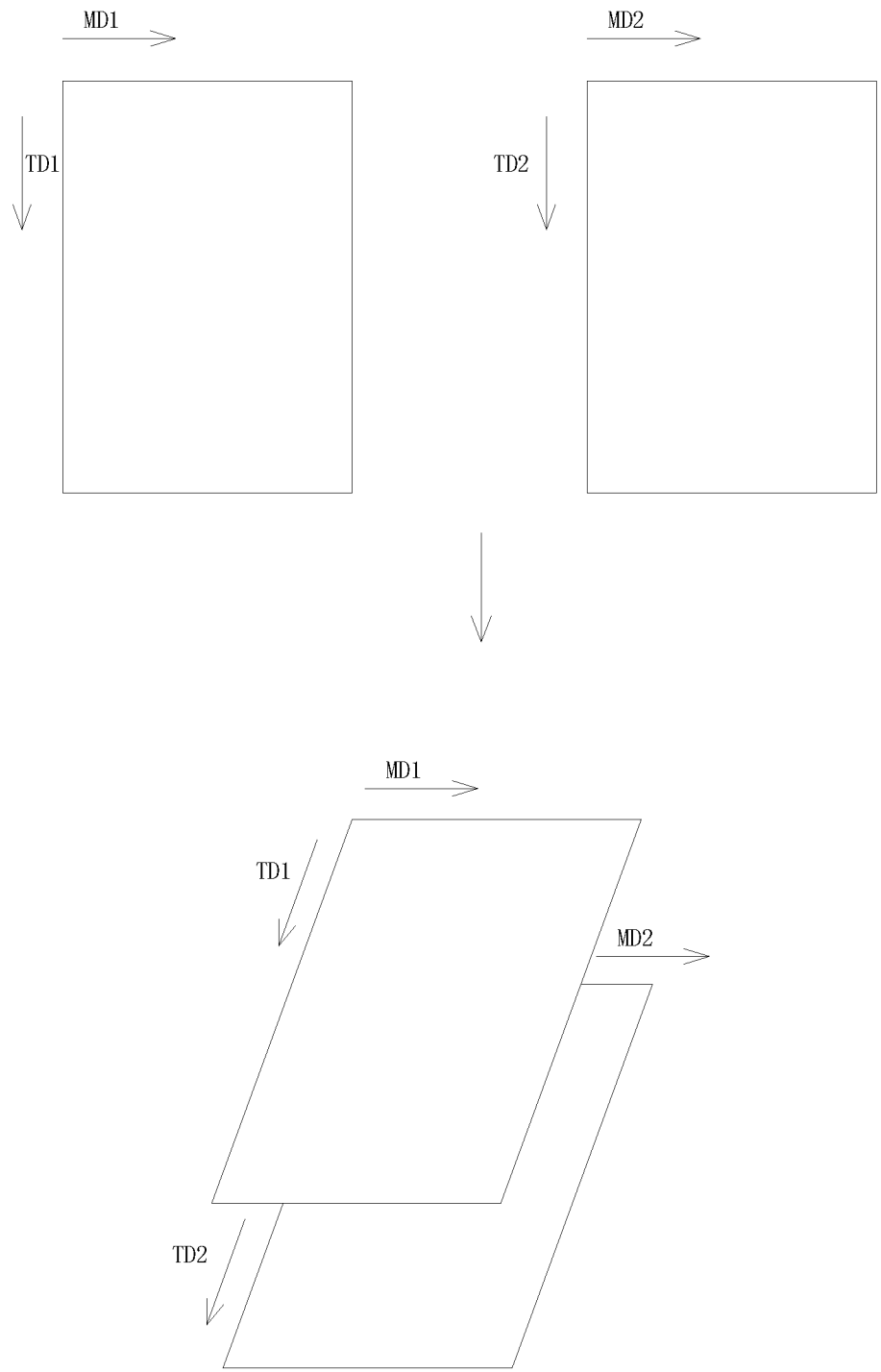
FIG. 4 is a schematic diagram showing that two layers are attached to each other according to an embodiment of the present disclosure.

When the first flexible layer 132 and the second flexible layer 136 are attached to each other, the orientation direction of the second flexible layer 136 is parallel to the orientation direction of the first flexible layer 132, as shown in FIG. 4.

The first flexible layer 132 has an orientation direction MD1 and a second direction TD1 perpendicular to the orientation direction MD1. The second flexible layer 136 has an orientation direction MD2 and a second direction TD2 perpendicular to the orientation direction MD2. Therefore, when the first flexible layer 132 and the second flexible layer 136 are attached to each other, the orientation direction MD1 of the first flexible layer 132 is parallel to the orientation direction MD2 of the second flexible layer 136, and the second direction TD2 of the first flexible layer 132 is parallel to the second direction TD2 of the second flexible layer 136, which facilitates obtaining a laminated structure with a high in-plane phase difference.

Figure 5:
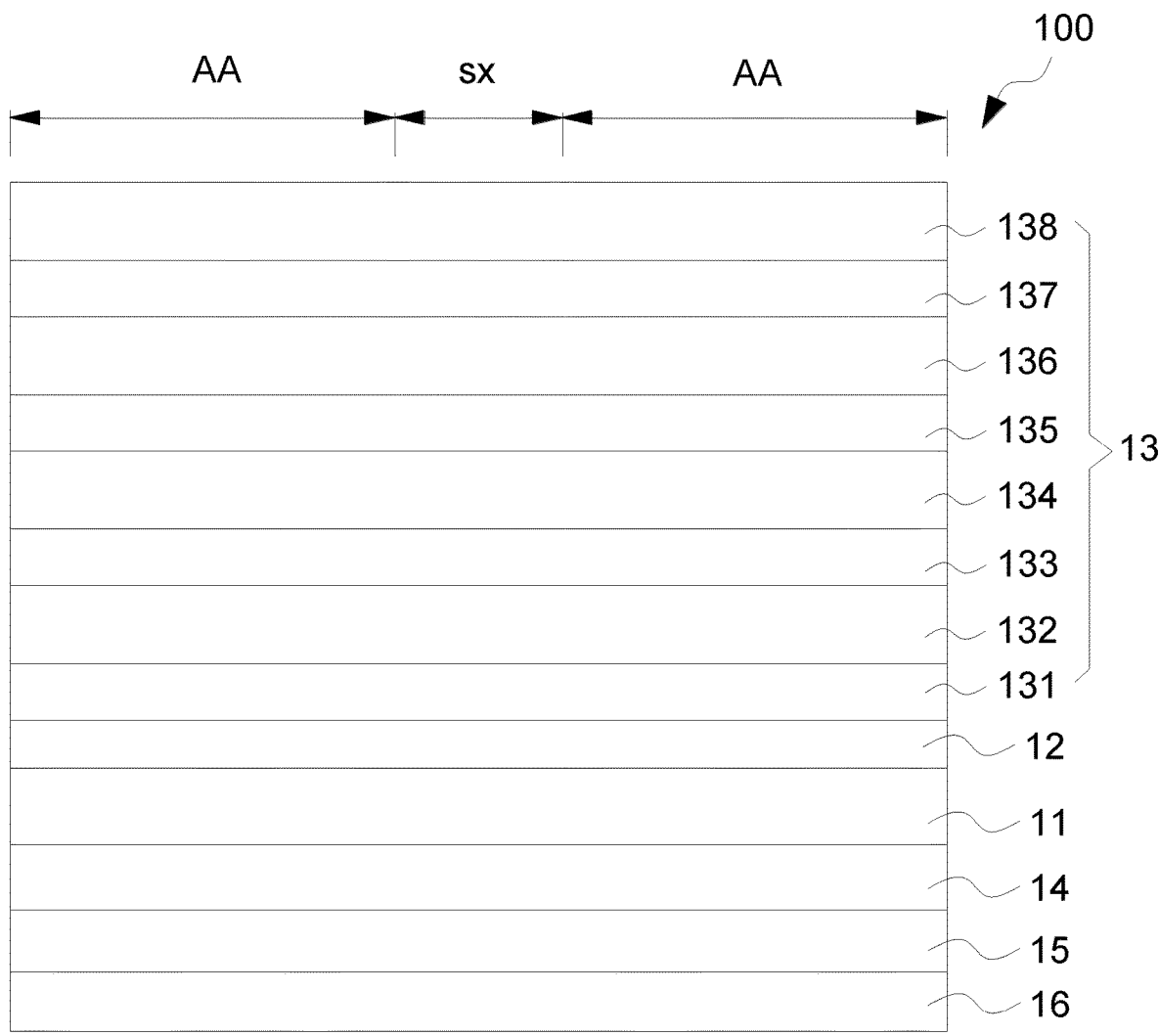
FIG. 5 is a schematic structural diagram of a display panel according to a fourth embodiment of the present disclosure.

Please refer to FIG. 5, a display panel 100 of a fourth embodiment differs from the display panel 100 of the third embodiment in that the cover module 13 further includes a fourth optical adhesive layer 137 and a third flexible layer 138.

The fourth optical adhesive layer 137 is disposed on a side of the second flexible layer 136 away from the polarizing layer 12.

The third flexible layer 138 is disposed on a side of the fourth optical adhesive layer 137 away from the polarizing layer 12.

A laminated structure of the first flexible layer 132, the hardened layer 134, the second flexible layer 136, and the third flexible layer 138 has an in-plane phase difference of less than or equal to 100 nm or greater than or equal to 7500 nm.

That is, the in-plane phase difference of the laminated structure of the first flexible layer 132, the hardened layer 134, the second flexible layer 136, and the third flexible layer 138 may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

Optionally, the in-plane phase difference of the third flexible layer 138 is same as the in-plane phase difference of the second flexible layer 136.

Optionally, an orientation direction of the third flexible layer 138 is parallel to the orientation direction of the second flexible layer 136.

When the third flexible layer 138 and the second flexible layer 136 are attached to each other, the orientation direction of the second flexible layer 136 is parallel to the orientation direction of the third flexible layer 138.

In some embodiments, an angle between the orientation direction of the third flexible layer 138 and the orientation direction of the second flexible layer 136 may be less than or equal to 15°, which may be 15°, 10°, 5°, or 0°.

In some embodiments, the in-plane phase difference of the third flexible layer 138 and the in-plane phase difference of the second flexible layer 136 may be different. For example, the in-plane phase difference of the third flexible layer 138 is greater than 0 nm, and the in-plane phase difference of the second flexible layer 136 may be 0 nm. When the in-plane phase difference of the second flexible layer 136 is 0 nm, the second flexible layer 136 has no obvious orientation direction.

Optionally, the first flexible layer 132, the second flexible layer 136, and the third flexible layer 138 are made of one of transparent polyimide (CPI), polyethylene terephthalate (PET), and triacetate cellulose (TAC), but are not limited thereto.

Figure 6:
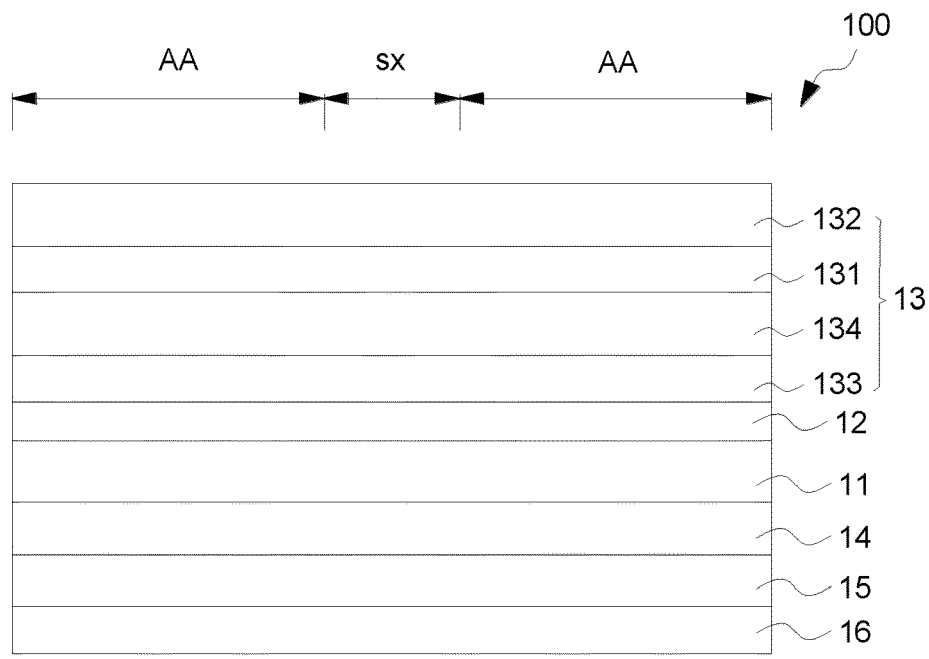
FIG. 6 is a schematic structural diagram of a display panel according to a fifth embodiment of the present disclosure.

Please refer to FIG. 6, a display panel 100 of a fifth embodiment differs from the display panel 100 of the first embodiment in that the cover module 13 further includes a second optical adhesive layer 133 and a hardening layer 134.

The second optical adhesive layer 133 is disposed on the side of the polarizing layer 12 away from the panel body 11.

The hardened layer 134 is disposed between the second optical adhesive layer 133 and the first optical adhesive layer 131, and disposed on a side of the first flexible layer 132 close to the polarizing layer 12.

A laminated structure of the hardened layer 134 and the first flexible layer 132 has an in-plane phase difference of less than or equal to 100 nm or greater than or equal to 7500 nm.

That is, the in-plane phase difference of the laminated structure of the first flexible layer 132 and the hardened layer 134 may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

The display panel 100 of the fifth embodiment differs from the display panel 100 of the second embodiment in that the hardened layer 134 is disposed at different positions. In the display panel 100 of the fifth embodiment, the hardened layer 134 is disposed on a side close to the polarizing layer 12 so that the hardened layer 134 is closer to the panel body 11 to better protect the panel body 11 and provide a better support plane.

Optionally, an edge of the first flexible layer 132 is flush with an edge of the first optical adhesive layer 131.

The first flexible layer 132 and the first optical adhesive layer 131 are first combined together, and then trimmed so that their edges are flush with each other, and then attached to the hardened layer 134. Compared with a process of coating the first optical adhesive layer 131 first and then attaching the first flexible layer 132, this process is simpler and makes attachment of the first flexible layer 132 more accurate.

Furthermore, the edge of the first flexible layer 132 is flush with the edge of the first optical adhesive layer 131, so that the first flexible layer 132 and the hardened layer 134 are adhered more completely.

Figure 7:
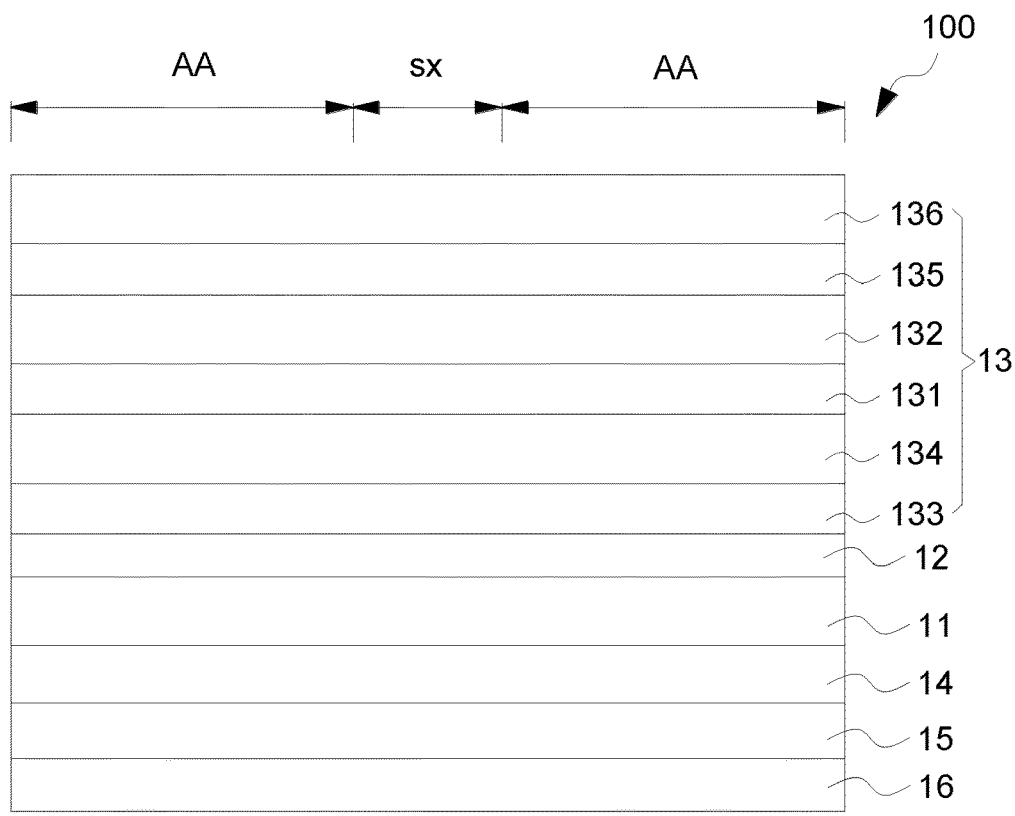
FIG. 7 is a schematic structural diagram of a display panel according to a sixth embodiment of the present disclosure.

Please refer to FIG. 7, a display panel 100 of a sixth embodiment differs from the display panel 100 of the fifth embodiment in that the cover module 13 further includes a third optical adhesive layer 135 and a second flexible layer 136.

The third optical adhesive layer 135 is disposed on a side of the first flexible layer 132 away from the polarizing layer 12.

The second flexible layer 136 is disposed on a side of the third optical adhesive layer 135 away from the polarizing layer 12.

A laminated structure of the hardened layer 134, the first flexible layer 132, and the second flexible layer 136 has an in-plane phase difference of less than or equal to 100 nm or greater than or equal to 7500 nm.

That is, the in-plane phase difference of the laminated structure of the hardened layer 134, the first flexible layer 132, and the second flexible layer 136 may be 100 nm, 95 nm, 80 nm, 70 nm, 60 nm, 50 nm, 40 nm, 30 nm, 20 nm, 10 nm, 7500 nm, 8000 nm, 8500 nm, 9500 nm, 10000 nm, 15000 nm, or the like.

Optionally, an in-plan phase difference of the hardened layer 134 may be 0 nm or other values.

Optionally, an angle between an orientation direction of the first flexible layer 132 and an orientation direction of the second flexible layer 136 is less than or equal to 15°, which may be 15°, 10°, 5°, or 0°.

Optionally, the orientation directions of the first flexible layer 132 and the second flexible layer 136 are parallel to each other, so as to improve the total in-plane phase difference.

Optionally, the in-plane phase difference of the first flexible layer 132 may be same as the in-plane phase difference of the second flexible layer 136, which is beneficial for reducing optical complexity and improving the rainbow stripes in photography.

Figure 8:
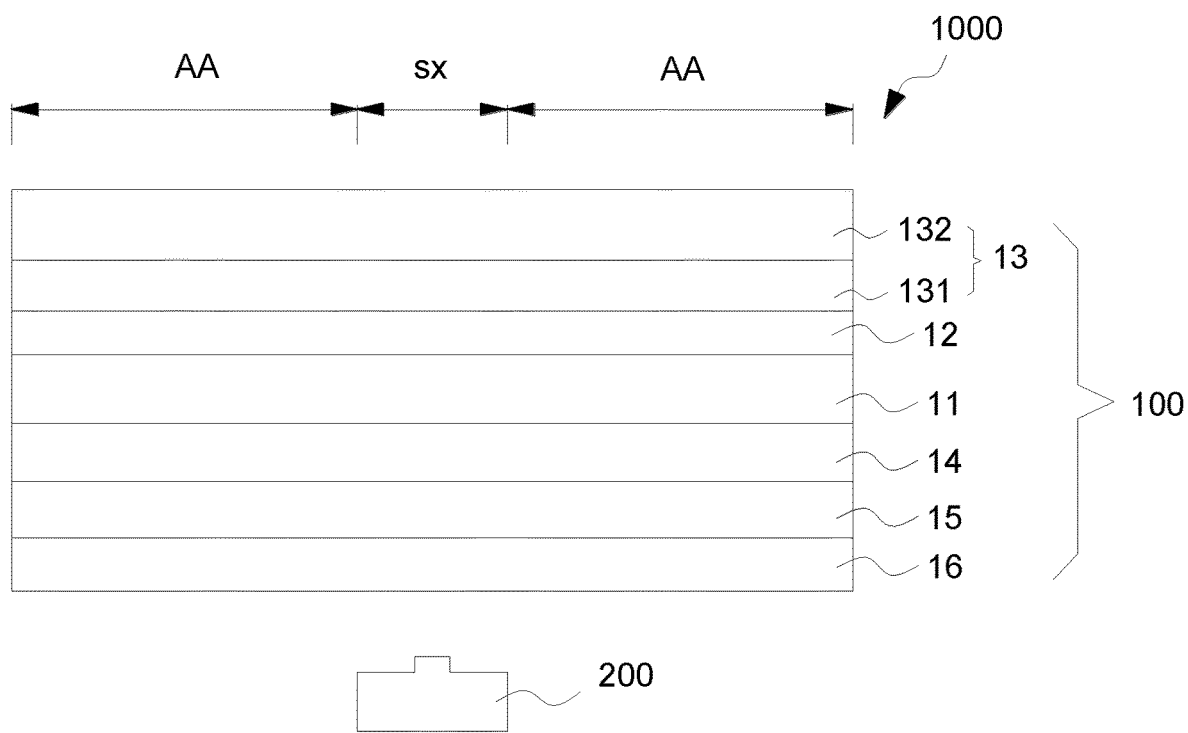
FIG. 8 is a schematic structural diagram of a display device according to an embodiment of the present disclosure.

Please refer to FIG. 8, the present disclosure further provides a display device 1000 comprising a camera 200 and the display panel 100 according to any of the above embodiments. The camera 200 is disposed under the display panel 100 and corresponds to the functional area sx.

Regarding the display panel 100, please refer to the above embodiments, which will not be described in detail herein.

In the display device 1000 of the present disclosure, the panel body 11 includes the functional area sx corresponding to the camera 200. The polarizing layer 12 is disposed on a light emitting side of the panel body 11. The cover module 13 is disposed on the side of the polarizing layer 12 away from the panel body 11. The portion of the cover module 13 corresponding to the functional area sx has a total in-plane phase difference of less than or equal to 100 nm or greater than or equal to 7500 nm.

In the present disclosure, the cover plate module 13 disposed on the polarizing layer 12 is set to have the total in-plane phase difference of less than or equal to 100 nm or greater than or equal to 7500 nm, thereby improving the rainbow stripes in the photos and improving shooting quality.

It should be noted that the display device 1000 shown in FIG. 8 includes the display panel 100 of the first embodiment, but is not limited thereto, for example, the display panel 100 of the second, third, or other embodiments may be included.

The display panel and the display device provided by the embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A display panel, comprising:
a panel body comprising a functional area and a display area surrounding at least a portion of the functional area;
a polarizing layer disposed on a light-emitting side of the panel body; and
a cover module disposed on a side of the polarizing layer away from the panel body, wherein at least a portion of the cover module corresponding to the functional area has a total in-plane phase difference of less than or equal to 100 nm or greater than or equal to 7500 nm;
wherein the cover module comprises:
a first optical adhesive layer disposed on the side of the polarizing layer away from the panel body;
a first flexible layer disposed on a side of the first optical adhesive layer away from the polarizing layer;
a second optical adhesive layer disposed on a side of the first flexible layer away from the polarizing layer;
a hardened layer disposed on a side of the second optical adhesive layer away from the polarizing layer;
a third optical adhesive layer disposed on a side of the hardened layer away from the polarizing layer; and
a second flexible layer disposed on a side of the third optical adhesive layer away from the polarizing layer;
wherein an angle between an orientation direction of the first flexible layer and an orientation direction of the second flexible layer is less than or equal to 15°, the orientation direction of the first flexible layer is a direction in which the first flexible layer is stretched, and the orientation direction of the second flexible layer is a direction in which the second flexible layer is stretched.

2. The display panel according to claim 1, wherein a portion of the cover module corresponding to the display area has a total in-plane phase difference of less than or equal to 100 nm or greater than or equal to 7500 nm.

3. The display panel according to claim 1,
wherein the first flexible layer having an in-plane phase difference of less than or equal to 100 nm or greater than or equal to 7500 nm.

4. The display panel according to claim 3,
wherein a laminated structure of the first flexible layer and the hardened layer has an in-plane phase difference of less than or equal to 100 nm or greater than or equal to 7500 nm.

5. The display panel according to claim 4,
wherein a laminated structure of the first flexible layer, the hardened layer, and the second flexible layer has an in-plane phase difference of less than or equal to 100 nm or greater than or equal to 7500 nm.

6. The display panel according to claim 5, wherein an edge of the second flexible layer is flush with an edge of the third optical adhesive layer.

7. The display panel according to claim 5, wherein the cover module further comprises:
a fourth optical adhesive layer disposed on a side of the second flexible layer away from the polarizing layer; and
a third flexible layer disposed on a side of the fourth optical adhesive layer away from the polarizing layer;
wherein a laminated structure of the first flexible layer, the hardened layer, the second flexible layer, and the third flexible layer has an in-plane phase difference of less than or equal to 100 nm or greater than or equal to 7500 nm.

8. The display panel according to claim 7, wherein an in-plane phase difference of the third flexible layer is same as an in-plane phase difference of the second flexible layer; and
wherein an orientation direction of the third flexible layer is parallel to the orientation direction of the second flexible layer.

9. The display panel according to claim 3,
wherein a laminated structure of the hardened layer and the first flexible layer has an in-plane phase difference of less than or equal to 100 nm or greater than or equal to 7500 nm.

10. The display panel according to claim 9, wherein an edge of the first flexible layer is flush with an edge of the first optical adhesive layer.

11. The display panel according to claim 1, wherein the orientation directions of the first flexible layer and the second flexible layer are parallel to each other.

12. The display panel according to claim 1, wherein an in-plane phase difference of the first flexible layer is same as an in-plane phase difference of the second flexible layer.

* * * * *